(12) United States Patent
Derat

(10) Patent No.: US 12,241,922 B2
(45) Date of Patent: Mar. 4, 2025

(54) OVER-THE-AIR TEST SYSTEM AND OVER-THE-AIR TEST METHOD

(71) Applicant: Rohde & Schwarz GmbH & Co. KG, Munich (DE)

(72) Inventor: Benoit Derat, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 141 days.

(21) Appl. No.: 18/069,280

(22) Filed: Dec. 21, 2022

(65) Prior Publication Data

US 2024/0210460 A1  Jun. 27, 2024

(51) Int. Cl.
*G01R 27/28* (2006.01)
*G01R 29/08* (2006.01)
*G01R 29/10* (2006.01)

(52) U.S. Cl.
CPC ....... *G01R 29/105* (2013.01); *G01R 29/0871* (2013.01)

(58) Field of Classification Search
CPC .. G01R 29/10; G01R 29/105; G01R 29/0814; G01R 29/0821; G01R 29/0878; G01R 29/0892; G01R 29/0871; G01R 31/001; G01R 1/0018
See application file for complete search history.

(56) References Cited

U.S. PATENT DOCUMENTS

| | | | |
|---|---|---|---|
| 4,901,080 A | 2/1990 | McHenry | |
| 6,191,744 B1 * | 2/2001 | Snow | G01R 29/10 343/765 |
| 2008/0309565 A1 * | 12/2008 | Villarroel | G01R 29/0871 702/57 |
| 2012/0157006 A1 * | 6/2012 | Hong | H01Q 1/2225 455/67.14 |
| 2015/0260772 A1 * | 9/2015 | Aubin | G01R 29/105 343/703 |

(Continued)

FOREIGN PATENT DOCUMENTS

| | | | |
|---|---|---|---|
| CN | 108896709 | * | 11/2018 |
| DE | 3691144 | * | 10/2022 |
| EP | 035371 A2 | | 2/1990 |

OTHER PUBLICATIONS

"Spherical Near-Field Automotive Antenna Measurement System", <https://www.youtube.com/watch?v=3ifPz1zw35l>.

(Continued)

*Primary Examiner* — Thang X Le
(74) *Attorney, Agent, or Firm* — CHRISTENSEN O'CONNOR JOHNSON KINDNESS PLLC

(57) ABSTRACT

An over-the-air (OTA) test system is described. The OTA test system includes an antenna positioner with at least one test antenna. The OTA test system further including a DUT positioner, wherein the DUT positioner is configured to hold a device under test in a measurement zone. The antenna positioner is configured to rotate the at least one test antenna around the measurement zone by adapting an elevation angle of the test antenna. The DUT positioner is configured to tilt the device under test by a predefined angle with respect to a height direction of the OTA test system, thereby adapting an elevation angle of the device under test. Further, an OTA test method is described.

21 Claims, 2 Drawing Sheets

(56) References Cited

U.S. PATENT DOCUMENTS

2018/0321292 A1* 11/2018 Bartko ............... G01R 29/0821
2018/0340975 A1* 11/2018 Herbrig ............. G01R 29/0821

OTHER PUBLICATIONS

"Full Vehicle Over-The-Air Antenna Test System", Rode & Schwarz Automotive Test Solution; 2021, 7 pages.
"Solutions for Automotive Antenna Pattern Measurement (APM)", ETS-LINDGREN; 2018, 4 pages.
"SGS Opens State-of-the-Art Vehicle OTA Performance Laboratory in Suzhou, China", SGS, 2022, <https://sgs-prd.imgix.net/-/media/sgscorp /images/temporary/sgs-auto-wireless-1600px.cdn.en.1.jpgfit=crop&crop=edges&auto-format&w=1200&h=630.
Multi-Probe Systems SG 3000, Microwave Vision Group, 2023, <https://www.mvg-world.com/en/products/antenna-measurement/multi-probe-systems/sg-3000>.
"Full Scale Aircraft Measurement", Microwave Vision Group, 2023, <https://www.mvg-world.com/en/industry/aerospace-defense/full-scale-aircraft-measurement>.
"Tilting and Rotating Cheops for EMC Testing", European Space Research and Technology Centre (ESTEC), Noordwijk, the Netherlands, Sep. 14, 2018, <https://sci.esa.int/web/cheops/-/60788-tilting-and-rotating-cheops-for-emc-testing>.

\* cited by examiner

OVER-THE-AIR TEST SYSTEM AND OVER-THE-AIR TEST METHOD

FIELD OF THE DISCLOSURE

Embodiments of the present disclosure generally relate to an over-the-air test system. Embodiments of the present disclosure further relate to an over-the-air test method.

BACKGROUND

In the state of the art, spherical over-the-air (OTA) test systems are known that are configured to test a predefined solid angle of a transmission and/or reception characteristic of a device under test.

Therein, the solid angle to be covered depends on the type of the device under test, and may be specified in corresponding test protocols provided by the manufacturer of the device under test or by law.

If the elevation angle range to be tested is large, the spatial requirements for such OTA test systems are rather high, as test rooms or test chambers having a height of over ten meters may be necessary in order to test a device under test over the full elevation angle range to be tested.

Thus, there is a need for an OTA test system and for an OTA test method that have reduced spatial requirements for performing measurements.

SUMMARY

Embodiments of the present disclosure provide an over-the-air (OTA) test system. In an embodiment, the OTA test system comprises an antenna positioner with at least one test antenna. The OTA test system further comprising a DUT positioner, wherein the DUT positioner is configured to hold a device under test in a measurement zone. The antenna positioner is configured to rotate the at least one test antenna around the measurement zone by adapting an elevation angle of the test antenna. The DUT positioner is configured to tilt the device under test by a predefined angle with respect to a height direction of the OTA test system, thereby adapting an elevation angle of the device under test.

The OTA test system according to the present disclosure is based on the idea to reduce the maximum necessary elevation angle of the test antenna, and thus the maximum necessary height of the test antenna by tilting the device under test by the predefined angle. Accordingly, the spatial requirements on the height of a room or a chamber housing the at least one test antenna are reduced as well.

Testing of the device under test usually requires performing multiple measurements at different elevation angles of the at least one test antenna starting at a predetermined first elevation angle and ending at a predetermined second elevation angle.

By tilting the device under test, this measurement elevation angle range is shifted by the predetermined angle. In other words, the plurality of measurements can be conducted at different elevation angles of the at least one test antenna starting at the predetermined first elevation angle minus the predefined elevation angle, and ending at the predetermined second elevation angle minus the predefined elevation angle. It has turned out that the maximum necessary height of the at least one test antenna can be reduced significantly by tilting the device under test.

For example, the necessary maximum height may be reduced by several meters.

The antenna positioner may be configured to rotate the at least one test antenna around the measurement zone at a constant distance from the measurement zone.

In some embodiments, the constant distance may be such that the at least one test antenna is located in a near-field region of the device under test. Thus, the spatial requirements on the height of the room or the chamber housing the at least one test antenna are further reduced.

According to an aspect of the present disclosure, the antenna positioner is configured, for example, to adapt a height of a center of rotation of the at least one test antenna with respect to the height direction of the OTA test system. Accordingly, the height of the center of rotation of the at least one test antenna can be adapted to match different positions of the device under test with respect to the height direction. Alternatively or additionally, the height of the center of rotation of the at least one test antenna can be adapted in order to measure different portions of the device under test, e.g. different antennas of the device under test being mounted at different heights.

According to another aspect of the present disclosure, the antenna positioner comprises, for example, a gantry. However, it is to be understood that the antenna positioner may be established in any other suitable way.

In an embodiment of the present disclosure, the gantry is rotatably mounted to a stationary base frame. Accordingly, the elevation angle of the at least one test antenna can be adapted by rotating the gantry about an attachment point of the gantry to the stationary base frame.

Therein, the term "stationary" refers to a room or a chamber housing the antenna positioner, e.g. an OTA test chamber.

A further aspect of the present disclosure provides that the at least one test antenna is mounted, for example, to a tip of the gantry. This way, the maximum range of motion is provided for the at least one test antenna.

In some embodiments, the DUT positioner is configured to rotate the device under test. For example, the DUT positioner may be configured to rotate the device under test such that a relative azimuth angle between the device under test and the at least one test antenna is adapted. Thus, measurements can be performed at different elevation angles of the at least one test antenna and for different relative azimuth angles between the device under test and the at least one test antenna.

Accordingly, from the viewpoint of the device under test, the individual measurement positions of the at least one test antenna are located on a sphere surrounding the device under test. Thus, the OTA test system is established as a spherical OTA test system, even if not the whole sphere may be actually covered with measurement points but only certain spherical shell segments.

According to an aspect of the present disclosure, the DUT positioner is configured, for example, to rotate the device under test about an axis being perpendicular to a tilted height axis, wherein the tilted height axis and the height direction of the OTA test system enclose the predefined angle. Thus, it is ensured that rotating the device under test only changes the relative azimuth angle between the device under test and the at least one test antenna, but not the relative elevation angle between the device under test and the at least one test antenna.

The DUT positioner may be configured to adapt a height of the device under test with respect to the height direction of the OTA test system. Accordingly, the device under test may be brought to the correct height for performing measurements if the measurement zone is higher or lower than a current position of the device under test.

For example, the DUT positioner may comprise a linear positioner, wherein the linear positioner is configured to adapt the position of the device under test along an axis being parallel to the height direction of the OTA test system. In an embodiment, the linear positioner may include a linear stage.

In an embodiment of the present disclosure, the predefined angle is larger than or equal to 5° and/or smaller than or equal to 45°. Accordingly, the device under test may be tilted by at least 5° and or/by at most 45°. The obtainable tilting angle may be limited by different factors, for example by the dimensions and the weight of the device under test. In general, a larger tilting angle corresponds to reduced height requirements of the OT a test system.

However, it is to be understood that other predefined angle ranges are possible, for example the device under test may be tilted by at least 10° and or/by at most 30°. As another example, the device under test may be tilted by at least 15° and/or by at most 25°.

In a further embodiment of the present disclosure, the antenna positioner is configured to rotate the at least one test antenna around the measurement zone, thereby adapting the elevation angle of the test antenna within a predetermined elevation angle range. The predetermined elevation angle range may correspond to the elevation angles that are necessary for performing a full test of the device under test, e.g. according to a test protocol associated with the device under test. As already described above, the at least one test antenna may be moved to several different measurement positions, namely to several different elevation angles between a predetermined first elevation angle and a predetermined second elevation angle. The predetermined first elevation angle and the predetermined second elevation angle confine the predetermined elevation angle range. At least one test may be performed by the at least one test antenna at each measurement position.

According to an aspect of the present disclosure, a magnitude of the predetermined elevation angle range, for example, is larger than or equal to 90° and smaller than 180°. Therein and in the following, the term "magnitude of the predetermined elevation angle range" is understood to denote the "length" of the interval confined by the predetermined first elevation angle and the predetermined second elevation angle described above. In other words, the magnitude of the predetermined elevation angle range corresponds to the angular range over which the measurement positions for performing measurements on the device under test extend.

The necessary magnitude may depend on the type of the device under test to be tested. In some embodiments, the necessary magnitude may be defined in test protocols associated with the device under test. For example, certain automotive applications require a magnitude of 120°.

In some embodiments, the OTA test system comprises a test chamber, wherein the test chamber comprises the DUT positioner and the antenna positioner with the at least one test antenna. Accordingly, a well-defined test environment is provided for testing the device under test in the test chamber.

The test chamber may be a shielded chamber, such that electromagnetic signals from outside of the test chamber do not interfere with measurements conducted within the test chamber.

According to another aspect of the present disclosure, the test chamber, for example, is an anechoic chamber. Accordingly, the test chamber comprises anti-reflection means that are configured to absorb electromagnetic waves generated by the device under test and/or by the at least one test antenna. Accordingly, it is ensured that unwanted reflections within the test chamber do not interfere with the measurements conducted in the device under test.

For example, the walls, the floor, and/or the ceiling of the test chamber may at least partially be covered with the anti-reflection means. Alternatively or additionally, the antenna positioner and/or the DUT positioner may at least partially be covered with the anti-reflection materials, surfaces, or other means.

The device under test may be a vehicle. Accordingly, at least one wireless communication system of the vehicle may be tested by the OTA test system, wherein the wireless communication system may be based on radar, LTE, 5G New Radio, WiFi, UWB, GNSS, V2X, DVB, and/or any other communication technology.

Therein and in the following, the term "vehicle" is understood to denote land vehicles, water vehicles, and air vehicles. Accordingly, the vehicle may be a car, a truck, a ship, an airplane, a helicopter, etc.

Embodiments of the present disclosure further provide an over-the-air (OTA) test method of testing a device under test. In an embodiment, the OTA test method comprises the steps of: positioning, by a DUT positioner, a device under test in a measurement zone; tilting, by the DUT positioner, the device under test by a predefined angle with respect to a height direction of the OTA test system, thereby adapting an elevation angle of the device under test; positioning, by an antenna positioner, at least one test antenna at a first elevation angle; conducting, by the at least one test antenna, a first measurement on the device under test at the first elevation angle; rotating, by the antenna positioner, the at least one test antenna to a second elevation angle, wherein the second elevation angle is different from the first elevation angle; and conducting, by the at least one test antenna, a second measurement on the device under test at the second elevation angle.

In some embodiments, the OTA test system described above is configured to perform the OTA test method.

Regarding the further advantages and properties of the OTA test method, reference is made to the explanations given above with respect to the OTA test system, which also hold for the OTA test system and vice versa.

According to an aspect of the present disclosure, measurements are conducted, for example, at a plurality of further elevation angles of the at least one test antenna. In some embodiments, multiple measurements may be performed at different elevation angles of the at least one test antenna starting at a predetermined first elevation angle and ending at a predetermined second elevation angle.

The plurality of further elevation angles may be evenly spaced, such that a uniform measurement grid is provided. However, it is also conceivable that the plurality of further elevation angles are unevenly spaced.

According to another aspect of the present disclosure, the device under test, for example, is rotated about an axis being perpendicular to a tilted height axis, wherein the tilted height axis and the height direction of the OTA test system enclose the predefined angle, and wherein a plurality of measurements are conducted at a plurality of further angles of the at least one test antenna after rotating the device under test. Thus, it is ensured that rotating the device under test only changes the relative azimuth angle between the device under test and the at least one test antenna, but not the relative elevation angle between the device under test and the at least one test antenna.

By rotating the device under test and by adapting the elevation angle of the at least one test antenna, measurements can be performed at different elevation angles of the at least one test antenna and for different relative azimuth angles between the device under test and the at least one test antenna.

Accordingly, from the viewpoint of the device under test, the individual measurement positions of the at least one test antenna may be located on a sphere surrounding the device under test. Thus, the OTA test system may be established as a spherical OTA test system, even if not the whole sphere may be actually covered with measurement points but only certain spherical shell segments.

In some embodiments, the elevation angle of the at least one test antenna is confined to a predetermined elevation angle range. The predetermined elevation angle range may correspond to the elevation angles that are necessary for performing a full test of the device under test, e.g. according to a test protocol associated with the device under test. As already described above, the at least one test antenna may be moved to several different measurement positions, namely to several different elevation angles between a predetermined first elevation angle and a predetermined second elevation angle. The predetermined first elevation angle and the predetermined second elevation angle confine the predetermined elevation angle range. At least one test may be performed by the at least one test antenna at each measurement position.

In an embodiment of the present disclosure, a magnitude of the predetermined elevation angle range is larger than or equal to 90° and smaller than 180°. The necessary magnitude may depend on the type of the device under test to be tested. In some embodiments, the necessary magnitude may be defined in test protocols associated with the device under test. For example, certain automotive applications require a magnitude of 120°.

In a further embodiment of the present disclosure, the predefined angle is larger than or equal to 5° and/or smaller than or equal to 45°. Accordingly, the device under test may be tilted by at least 5° and or/by at most 45°. The obtainable tilting angle may be limited by different factors, for example by the dimensions and the weight of the device under test. In general, a larger tilting angle corresponds to reduced height requirements of the OT a test system.

However, it is to be understood that other predefined angle ranges are possible, for example the device under test may be tilted by at least 10° and or/by at most 30°. As another example, the device under test may be tilted by at least 15° and/or by at most 25°.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
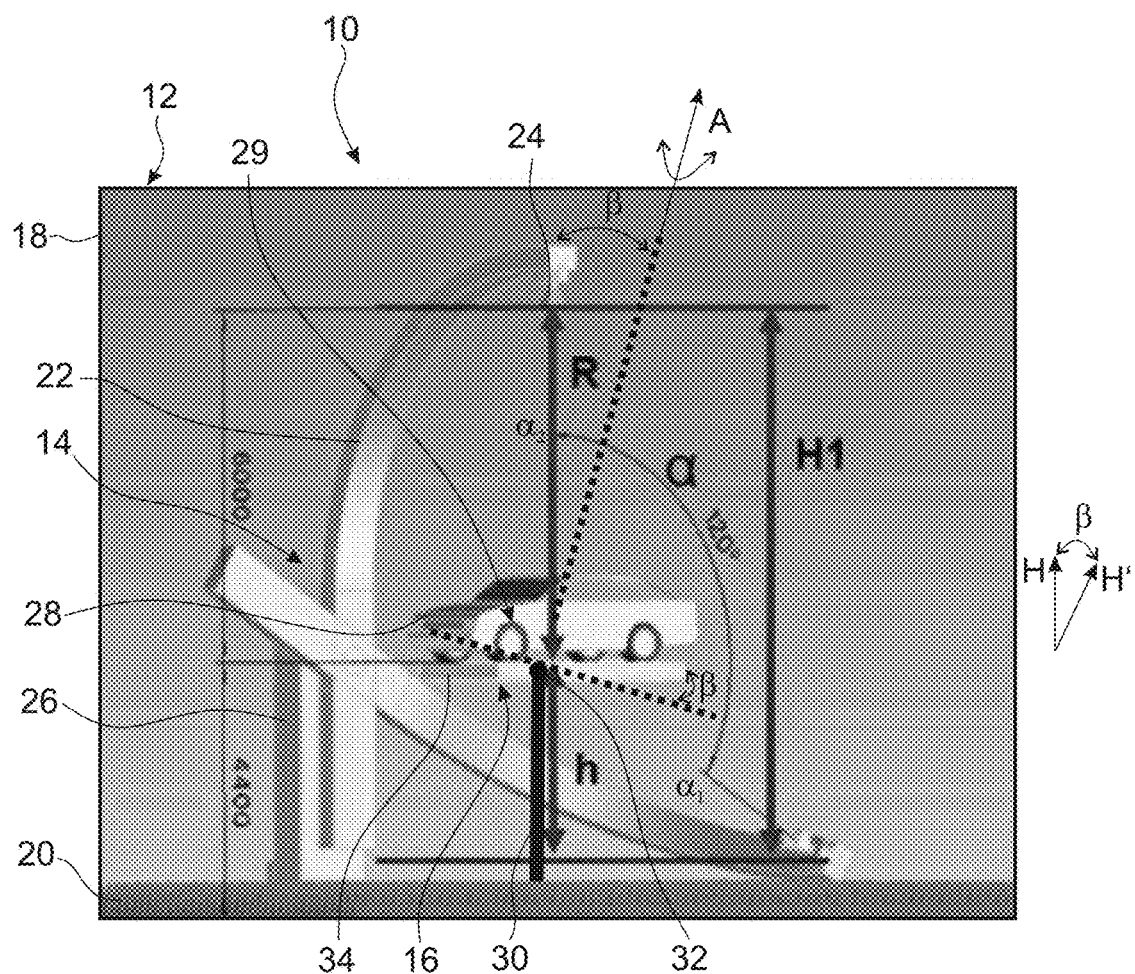
FIG. 1 schematically shows an over-the-air test system according to an embodiment of the present disclosure.

FIG. 1 schematically shows an example of an over-the-air (OTA) test system 10. As shown in FIG. 1, the OTA test system 10 comprises a test chamber 12 housing an antenna positioner 14 and a DUT positioner 16. In an embodiment, the test chamber 12 is established as an anechoic shielded chamber. Accordingly, the test chamber 12 comprises a housing 18 being configured to shield an interior of the housing 18 from external electromagnetic waves.

The test chamber 12 further comprises anti-reflection means 20, wherein the walls, the floor, and/or the ceiling of the test chamber 12 or of the housing 18 may at least partially be covered with the anti-reflection means 20. Alternatively or additionally, the antenna positioner 14 and/or the DUT positioner 16 may at least partially be covered with the anti-reflection means 20. In some embodiments, the anti-reflection means 20 can be any material, surface treatment, uneven structure, etc., that aids in the prevention of signals reflecting from interior surfaces of the test chamber 12.

In some embodiment, the antenna positioner 14 comprises a gantry 22, wherein at least one test antenna 24 is mounted to a tip of the gantry 22. The antenna positioner 14 further comprises a stationary base frame 26, wherein the gantry 22 is rotatably mounted to the stationary base frame 26 such that an elevation angle of the at least one test antenna 24 can be adapted by rotating the gantry 22 about an attachment point of the gantry 22 to the stationary base frame 26, as is indicated by the two different positions of the gantry 22 shown in FIG. 1.

In general, the DUT positioner 16 is configured to hold a device under test 28 in a measurement zone 29, namely at a certain distance from the at least one test antenna 24. For example, the DUT positioner 16 may be configured to hold the device under test 28 in a near-field region of the at least one test antenna 24.

In some embodiments, the DUT positioner 16 comprises a linear positioner 30 such as a motorize or non-motorized linear stage, wherein the linear positioner 30 is configured to adapt the position of the device under test along an axis being parallel to a height direction H of the OTA test system 10.

The DUT positioner 16 further comprises tilting means 32 that are configured to tilt the device under test 28 by a predefined angle β with respect to the height direction H of the OTA test system 10. For example, the tilting means 32 may comprise suitable hinges, levers, actuators, etc., that are configured to tilt the device under test 28 or a platform 34 onto which the device under test 28 is placed. In an embodiment, the tilting means 32 may be attached to the linear positioner 30.

The DUT positioner 16 and/or the platform 34 may be configured to rotate the device under test 28 about an axis A being parallel to a tilted height axis H', wherein the tilted height axis H' and the height direction H of the OTA test system 10 enclose the predefined angle β. In other words, the axis A is perpendicular to the tilted platform 34. For example, the platform 34 may comprise a turntable, wherein the device under test 28 is placed on the turntable. Accordingly, the device under test 28 can be rotated by rotating the turntable of the platform 34. In some embodiments, the DUT positioner 16 comprises the turntable.

In general, the OTA test system 10 is configured to perform OTA measurements on the device under test 28. In the example embodiment shown in FIG. 1, the device under test 28 is established as a car. However, it is to be understood that the device under test 28 may be established as any other type of vehicle or, In some embodiments, as any other type of electronic device to be tested.

Figure 2:
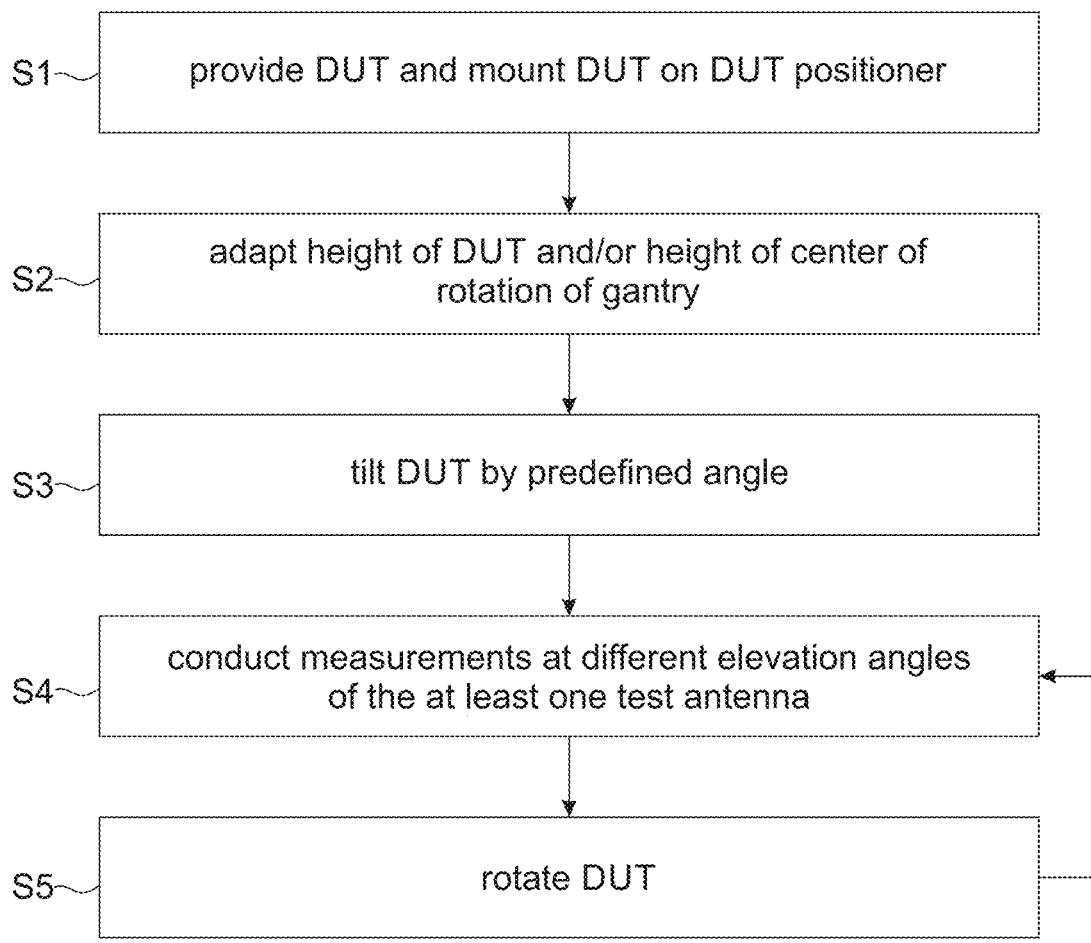
FIG. 2 shows an example of a flow chart of an over-the-air test method according to an embodiment of the present disclosure.

An OTA test method can be performed by the OTA test system 10, an example of which is set forth in FIG. 2.

The device under test 28 is provided and mounted on the DUT positioner 16 (step S1). In the example embodiment shown in FIG. 1, the device under test 28 is placed on the platform 34.

A height of the device under test 28 and/or a height of a center of rotation of the gantry 22 are/is adapted such that the device under test 28 is placed in the measurement zone 29 (step S2). Therein, the height of the device under test 28 may be adapted by the DUT positioner 16, for example by the linear positioner 30. If necessary, the height of the center of rotation of the gantry 22 may be adapted by the antenna positioner 14. For example, the antenna positioner may comprise a linear positioner being configured to reposition the gantry 22 along the height direction H of the OTA test system 10.

The device under test 28 is tilted by the predefined angle β (step S3). For example, the device under test 28 may be tilted by at least 5° and or/by at most 45°. The obtainable tilting angle β may be limited by different factors, for example by the dimensions and the weight of the device under test 28. However, it is to be understood that other predefined angle ranges are possible.

A plurality of measurements are conducted by the at least one test antenna 24 at different elevation angles of the at least one test antenna 24 (step S4). Therein, the elevation angle of the at least one test antenna 24 is adapted by rotating the gantry 22 about its attachment point to the stationary base frame 26. In some embodiments, multiple measurements are performed at different elevation angles of the at least one test antenna 24 starting at a predetermined first elevation angle ($\alpha\_1-\beta$) and ending at a predetermined second elevation angle ($\alpha\_2-\beta$). Therein, the angles $\alpha\_1$ and $\alpha\_2$ correspond to the elevation angles that have to be covered without tilting the device under test 12.

In the example embodiment of FIG. 1, it holds $\alpha\_1=60°$ and $\alpha\_2=180°$. Accordingly, the plurality of measurements cover an elevation angle range of magnitude $(\alpha\_2-\beta)-(\alpha\_1-\beta)=\alpha\_2-\alpha\_1=\alpha=120°$, which is a suitable magnitude for performing automotive OTA tests.

Accordingly, from the viewpoint of the OTA test system 10, the elevation angle range covered by the measurements is shifted by the predefined angle β. From the viewpoint of the device under test 28, the elevation angle range covered by the measurements is unaltered.

The different elevation angles may be evenly spaced, such that a uniform measurement grid is provided over the elevation angle range covered by the measurements. However, it is also conceivable that the different elevation angles are unevenly spaced.

The device under test 28 is rotated by the DUT positioner 16, such that a relative azimuth angle between the device under test 28 and the at least one test antenna 24 is adapted by a predefined azimuth angle. (step S5).

The measurements described above with respect to step S4 are repeated at the adapted relative azimuth angle between the device under test 28 and the at least one test antenna 24. Afterwards, step S5 may be repeated, i.e. the relative azimuth angle between the device under test 28 and the at least one test antenna 24 may be adapted by rotating the device under test 28. Steps S4 and S5 may be repeated for a predetermined azimuth angle range, for example for the complete azimuth angle range of 360°.

The different relative azimuth angles may be evenly spaced, such that a uniform measurement grid is provided over the azimuth angle range covered by the measurements. However, it is also conceivable that the different relative azimuth angles are unevenly spaced.

Accordingly, from the viewpoint of the device under test 28, the individual measurement positions of the at least one test antenna 24 are located on a sphere surrounding the device under test 28. However, it is noted that not the whole sphere may be actually covered with measurement points. Instead, measurement points may be provided on certain spherical shell segments that may be defined by a test protocol associated with the device under test 28.

With the OTA test method described above, the maximum height of the at least one test antenna 24, i.e. the height of the at least one test antenna 24 at the highest measurement point, is reduced.

As is illustrated in the example embodiment of FIG. 1, the height covered by the at least one test antenna 24 between the first elevation angle $\alpha\_1$ and the second elevation angle $\alpha\_2$ without tilting the device under test 28 is $H\_1=R+h=R(1-\cos(\alpha))\approx9m$.

By tilting the device under test 28 as described above, the height covered by the at least one test antenna 24 between the first elevation angle $(\alpha\_1-\beta)$ and the second elevation angle $(\alpha\_2-\beta)$ is $H\_2=R(1-\cos(\alpha-\beta))$. For example, for $\beta=20°$, it holds $H\_2 / H\_1 \approx 78.2\%$, i.e. the necessary height is reduced by about 22 percent.

In some embodiments, the antenna positioner 14 and/or the DUT positioner 16, and/or associated components thereof, may include electric, pneumatic, or hydraulic motors for causing the gantry, the linear stage, and/or the platform to move as set forth herein. In some embodiments, circuitry (e.g., one or more circuits) may be employed in order to generate control signals and to transmit such control signals for controlling the motors, etc.

Circuitry of any type can be used. In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air (OTA) test system, wherein the OTA test system has a height direction extending perpendicularly to a floor on which the OTA test system is provided, the OTA test system comprising:
   an antenna positioner associated with at least one test antenna, the antenna positioner configured to rotate the at least one test antenna around a measurement zone by adapting an elevation angle of the test antenna;
   a DUT positioner configured to hold a device under test in the measurement zone, wherein the DUT positioner is configured to tilt the device under test by a predefined angle β with respect to the height direction of the OTA test system, thereby adapting an elevation angle of the device under test, wherein the antenna positioner is configured to rotate the at least one test antenna around the measurement zone between a predetermined first elevation angle ($\alpha_1$-β) and a predetermined second elevation angle ($\alpha_2$-β), wherein $\alpha_1$ and $\alpha_2$ correspond to elevation angles that are to be covered for performing measurements on the device under test without tilting the device under test.

2. The OTA test system of claim 1, wherein the antenna positioner is configured to adapt a height of a center of rotation of the at least one test antenna with respect to the height direction of the OTA test system.

3. The OTA test system of claim 1, wherein the antenna positioner comprises a gantry.

4. The OTA test system of claim 3, wherein the gantry is rotatably mounted to a stationary base frame.

5. The OTA test system of claim 3, wherein the at least one test antenna is mounted to a tip of the gantry.

6. The OTA test system of claim 1, wherein the DUT positioner is configured to rotate the device under test.

7. The OTA test system of claim 6, wherein the DUT positioner is configured to rotate the device under test about an axis being parallel to a tilted height axis, wherein the tilted height axis and the height direction of the OTA test system enclose the predefined angle β.

8. The OTA test system of claim 1, wherein the DUT positioner is configured to adapt a height of the device under test with respect to the height direction of the OTA test system.

9. The OTA test system of claim 1, wherein the predefined angle β is larger than or equal to 5° and/or smaller than or equal to 45°.

10. The OTA test system of claim 1, wherein the antenna positioner is configured to rotate the at least one test antenna around the measurement zone, thereby adapting the elevation angle of the test antenna within a predetermined elevation angle range α, wherein $\alpha=\alpha_2-\alpha_1$.

11. The OTA test system of claim 10, wherein a magnitude of the predetermined elevation angle range α is larger than or equal to 90° and smaller than 180°.

12. The OTA test system of claim 1, wherein the OTA test system comprises a test chamber, wherein the test chamber comprises the DUT positioner and the antenna positioner with the at least one test antenna.

13. The OTA test system of claim 12, wherein the test chamber is an anechoic chamber.

14. The OTA test system of claim 1, wherein the device under test is a vehicle.

15. An over-the-air (OTA) test method of testing a device under test by an OTA test system, the OTA test system comprising an antenna positioner, a DUT positioner, and at least one test antenna, the OTA test method comprising:
   positioning, by the DUT positioner, a device under test in a measurement zone;
   tilting, by the DUT positioner, the device under test by a predefined angle β with respect to a height direction of the OTA test system, thereby adapting an elevation angle of the device under test, wherein the height direction extends perpendicularly to a floor on which the OTA test system is provided;
   positioning, by the antenna positioner, the at least one test antenna at a first elevation angle, wherein the antenna positioner is configured to rotate the at least one test antenna around the measurement zone between a predetermined first elevation angle ($\alpha_1$-β) and a second predetermined elevation angle ($\alpha_2$-β), wherein $\alpha_1$, and $\alpha_2$ correspond to elevation angles that are to be covered for performing measurements on the device under test without tilting the device under test;
   conducting, by the at least one test antenna, a first measurement on the device under test at the first elevation angle;
   rotating, by the antenna positioner, the at least one test antenna to a second elevation angle, wherein the second elevation angle is different from the first elevation angle; and
   conducting, by the at least one test antenna, a second measurement on the device under test at the second elevation angle.

16. The OTA test method of claim 15, wherein measurements are conducted at a plurality of further elevation angles of the at least one test antenna.

17. The OTA test method of claim 15, wherein the device under test is rotated about an axis being perpendicular to a tilted height axis, wherein the tilted height axis and the height direction of the OTA test system enclose the predefined angle, and wherein a plurality of measurements are conducted at a plurality of further angles of the at least one test antenna after rotating the device under test.

18. The OTA test method of claim 15, wherein the elevation angle of the at least one test antenna is confined to a predetermined elevation angle range, wherein the predetermined elevation angle range is confined by the predetermined first elevation angle $(\alpha_1-\beta)$ and the predetermined second elevation angle $(\alpha_2-\beta)$.

19. The OTA test method of claim 18, wherein a magnitude $\alpha=\alpha_2-\alpha_1$ of the predetermined elevation angle range is larger than or equal to 90° and smaller than 180°.

20. The OTA test method of claim 15, wherein the predefined angle $\beta$ is larger than or equal to 5° and/or smaller than or equal to 45°.

21. An over-the-air (OTA) test system, wherein the OTA test system has a height direction extending perpendicularly to a floor on which the OTA test system is provided, the OTA test system comprising:

an antenna positioner associated with at least one test antenna, the antenna positioner configured to rotate the at least one test antenna around a measurement zone by adapting an elevation angle of the test antenna;

a DUT positioner configured to hold a device under test in the measurement zone, wherein the DUT positioner is configured to tilt the device under test by a predefined angle $\beta$ with respect to the height direction of the OTA test system, thereby adapting an elevation angle of the device under test, wherein the antenna positioner comprises a gantry and a stationary base frame, wherein the gantry is rotatably mounted to the stationary base frame, wherein the at least one test antenna is mounted to the gantry, wherein the antenna positioner is configured to adapt the elevation angle of the at least one test antenna by rotating the gantry about an attachment point of the gantry to the stationary base frame, and wherein the antenna positioner is configured to adapt a height of a center of rotation of the gantry, thereby adapting a height of a center of rotation of the at least one test antenna with respect to the height direction of the OTA test system.

* * * * *